United States Patent
Xie et al.

(10) Patent No.: US 7,138,690 B2
(45) Date of Patent: Nov. 21, 2006

(54) SHIELDING STRUCTURE FOR USE IN A METAL-OXIDE-SEMICONDUCTOR DEVICE

(75) Inventors: Zhijian Xie, Allentown, PA (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/623,983

(22) Filed: Jul. 21, 2003

(65) Prior Publication Data

US 2005/0017298 A1   Jan. 27, 2005

(51) Int. Cl.
*H01L 29/78* (2006.01)
(52) U.S. Cl. .............................. 257/401; 257/E29.255
(58) Field of Classification Search ........ 257/340–344, 257/401
See application file for complete search history.

(56) References Cited

U.S. PATENT DOCUMENTS 5,470,791 A * 11/1995 Suguro et al. .............. 438/301
6,707,102 B1 * 3/2004 Morikawa et al. .......... 257/340

* cited by examiner

*Primary Examiner*—Evan Pert

(57) ABSTRACT

An MOS device is formed comprising a semiconductor layer of a first conductivity type, a first source/drain region of a second conductivity type formed in the semiconductor layer, and a second source/drain region of the second conductivity type formed in the semiconductor layer and spaced apart from the first source/drain region. The MOS device further comprises a gate formed proximate an upper surface of the semiconductor layer and at least partially between the first and second source/drain regions, and a shielding structure formed proximate the upper surface of the semiconductor layer and between the gate and the second source/drain region, the shielding structure being electrically connected to the first source/drain region, the shielding structure being spaced laterally from the gate and being non-overlapping relative to the gate. In this manner, the MOS device is substantially compatible with a CMOS process technology.

17 Claims, 5 Drawing Sheets

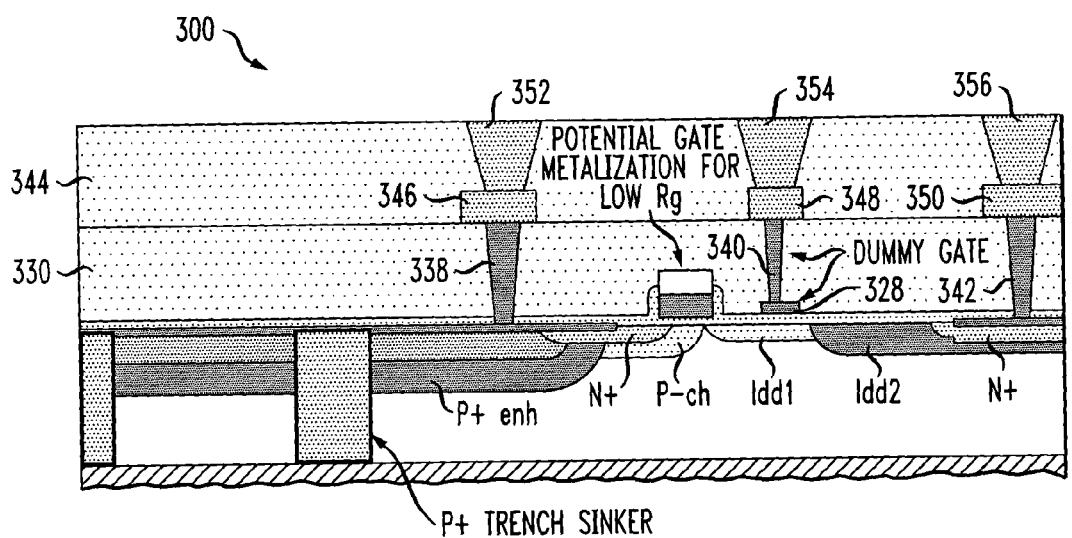

SHIELDING STRUCTURE FOR USE IN A METAL-OXIDE-SEMICONDUCTOR DEVICE

FIELD OF THE INVENTION

The present invention relates generally to semiconductor devices, and more particularly relates to techniques for improving high-frequency performance in a metal-oxide-semiconductor (MOS) device.

BACKGROUND OF THE INVENTION

Power MOS devices, including laterally diffused metal-oxide-semiconductor (LDMOS) devices, are employed in a variety of applications, such as, for example, power amplifiers in wireless communications systems. In applications where high-frequency operation is desired, such as in a radio frequency (RF) range (e.g., above 1 gigahertz (GHz)), a conventional LDMOS device may employ a dummy gate structure stacked on the traditional gate to reduce the Miller capacitance Cgd between the gate and drain of the device, thereby improving the high-frequency performance of the device, and to reduce hot-carrier induced (HCI) degradation in the device.

It is known that the effectiveness of the dummy gate, which may be measured by, for example, a reduction in miller capacitance and/or HCI degradation associated with the LDMOS device, can be improved by reducing the thickness of the dielectric layer (gate dielectric) underneath the dummy gate. However, reducing the gate dielectric thickness increases the gate-to-source capacitance Cgs (i.e., input capacitance) of the device, thereby undesirably affecting the high-frequency performance. The increase in the input capacitance of the device resulting from the reduction in gate dielectric thickness often significantly undermines any beneficial reduction in the miller capacitance provided by the dummy gate. Moreover, the conventional dummy gate structure is generally not compatible with a complementary MOS (CMOS) process technology due, at least in part, to the height of the gate/dummy gate stack. As an added drawback, the conventional dummy gate structure prevents full gate metalization, which is one known method for dramatically reducing the resistance Rg of the gate, thus further limiting the high-frequency performance of the LDMOS device. Since the output gain of the MOS device is inversely proportional to the gate resistance of the device, increasing the gate resistance results in a decrease in the output gain of the device, which is particularly undesirable in an amplifier application.

Previous attempts to improve the high-frequency performance of the LDMOS device have primarily focused on optimizing the trade-off between dummy gate effectiveness and input capacitance. These prior attempts, however, have been unsuccessful at providing a CMOS process compatible LDMOS device capable of high-frequency operation. Accordingly, there exists a need for an LDMOS device capable of improved high-frequency performance without increasing HCI degradation in the device. Furthermore, it would be desirable if such an LDMOS device was fully compatible with a CMOS process technology.

SUMMARY OF THE INVENTION

The present invention provides techniques for improving a high-frequency performance of an MOS device without significantly impacting the HCI degradation characteristics of the device. Moreover, the techniques of the present invention can be used to fabricate an integrated circuit (IC) device, for example, an LDMOS device, using conventional CMOS compatible process technology. Consequently, the cost of manufacturing the IC device is not significantly increased.

In accordance with one aspect of the invention, an MOS device is formed comprising a semiconductor layer of a first conductivity type, a first source/drain region of a second conductivity type formed in the semiconductor layer, and a second source/drain region of the second conductivity type formed in the semiconductor layer and spaced apart from the first source/drain region. The MOS device further comprises a gate formed proximate an upper surface of the semiconductor layer and at least partially between the first and second source/drain regions, and a shielding structure formed proximate the upper surface of the semiconductor layer and between the gate and the second source/drain region, the shielding structure being electrically connected to the first source/drain region, the shielding structure being spaced laterally from the gate and being non-overlapping relative to the gate. In this manner, the LDMOS device exhibits improved high-frequency performance and is also substantially compatible with a CMOS process technology.

These and other features and advantages of the present invention will become apparent from the following detailed description of illustrative embodiments thereof, which is to be read in connection with the accompanying drawings.

BRIEF DESCRIPTION OF THE DRAWINGS

FIG. 3A–3I are cross-sectional views depicting steps in a semiconductor fabrication process which may be used in forming the exemplary LDMOS device shown in FIG. 2.

DETAILED DESCRIPTION OF THE PREFERRED EMBODIMENTS

The present invention will be described herein in the context of an illustrative CMOS integrated circuit fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to an MOS device comprising a novel shielding structure which advantageously enables the MOS device to provide improved high-frequency performance while achieving high gain and reducing HCI degradation effects. Moreover, the shielding structure is fully compatible with a CMOS process technology. Although implementations of the present invention are described herein with specific reference to an LDMOS device, it is to be appreciated that the techniques of the present invention are similarly applicable to other devices, such as, but not limited to, a vertical diffused MOS (DMOS) device, an extended drain MOS device, etc., with or without modifications thereto, as will be understood by those skilled in the art.

It is to be understood that the various layers and/or regions shown in the accompanying figures may not be drawn to scale. Furthermore, certain semiconductor layers may have been omitted for ease of explanation.

Figure 1:
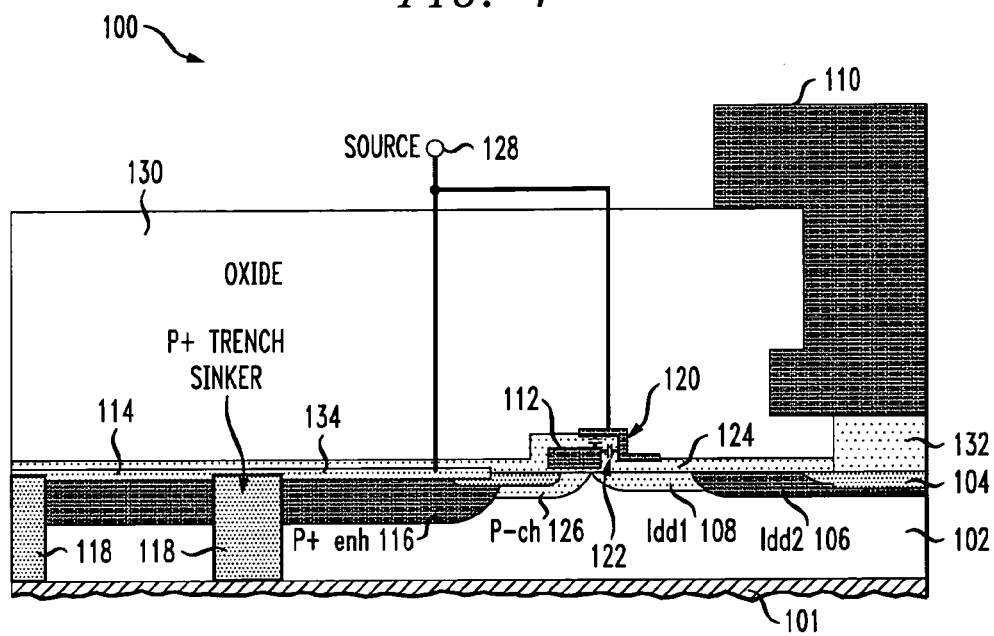
FIG. 1 is a cross-sectional view illustrating an example of an LDMOS device in which the invention can be implemented.

FIG. 1 illustrates a cross-sectional view of at least a portion of a semiconductor wafer 100 in which the techniques of the present invention may be implemented. The wafer 100 includes an LDMOS device formed on a substrate 101. The LDMOS device includes a source region 114 and a drain region 104 formed in an epitaxial region 102 of the wafer 100. The LDMOS device further includes a gate 112 formed above a channel region 126 of the device. The channel region 126 is at least partially formed between the source and drain regions. A lightly-doped drain (LDD) region is generally formed in the epitaxial layer 102 of the LDMOS device, which may comprise a first LDD region (ldd1) 108 and a second LDD region (ldd2) 106 formed between the channel region 126 and drain region 104.

The LDMOS device also includes a drain terminal 110, electrically connected to the drain region 104 via a silicide layer 132 formed over the drain region 104, and a source terminal 128, electrically connected to the source region 114 via a silicide layer 134 formed over the source region 114. An enhancement region 116 associated with the source region 114 may be formed below the source region. One or more trench sinkers 118 may be formed through the epitaxial layer 102 for providing an electrical connection between the source region 114 and the substrate 101. An oxide layer 130 is generally formed on an upper surface of the wafer to electrically isolate the source, drain and gate terminals of the device as well as to protect the device.

A dummy gate 120 may be added to the LDMOS device. The dummy gate 120 is conventionally formed such that at least a portion of the dummy gate 120 overlaps the gate 112 as shown. An oxide layer 124 is typically formed on an upper surface of the wafer so as to electrically isolate the gate 112 from the dummy gate 120. Although the dummy gate 120 may reduce the gate-to-drain capacitance Cgd and improve HCI degradation in the device, it also undesirably introduces additional gate capacitance 122. Since both the gate-to-dummy gate distance and the dummy gate-to-LDD region distance is determined primarily by the same gate oxide process, this additional capacitance 122 cannot be readily reduced using conventional methodologies. Furthermore, stacking the dummy gate 120 on top of the gate 112 prevents full metalization of the gate 112. Full gate metalization is desirable for reducing the gate resistance Rg of the LDMOS device, thereby improving high-frequency performance of the device.

Figure 2:
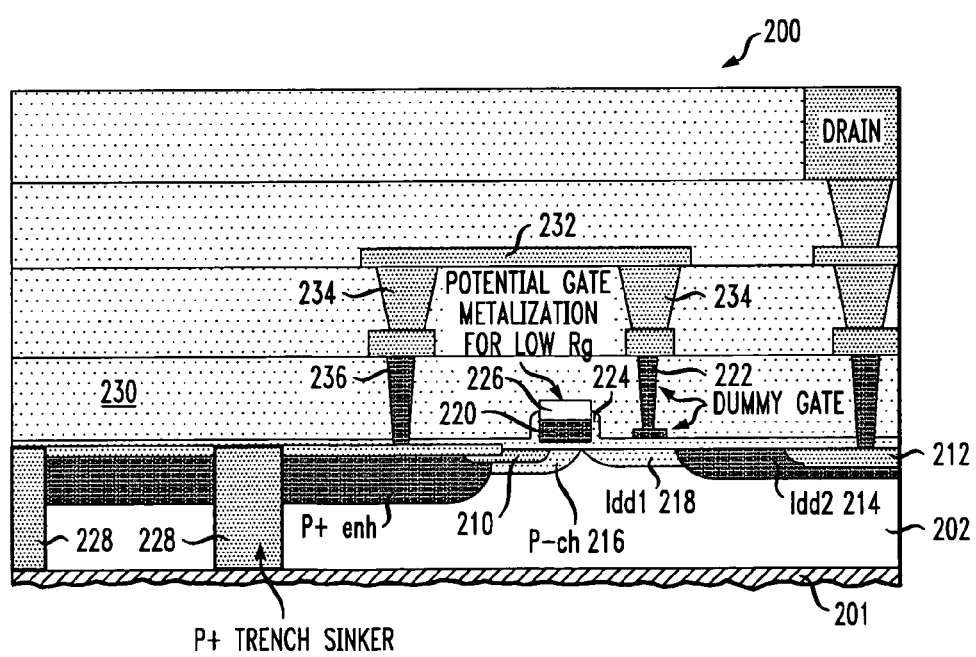
FIG. 2 is a cross-sectional view illustrating at least a portion of an exemplary LDMOS device, formed in accordance with an illustrative embodiment of the present invention.

FIG. 2 illustrates a cross-sectional view of at least a portion of a semiconductor wafer 200 in which the techniques of the present invention are implemented. As previously stated, the various layers and/or regions shown in the figure may not be drawn to scale and certain semiconductor layers may have been omitted for ease of explanation. The wafer 200 includes an exemplary LDMOS device formed on a semiconductor substrate 201. The substrate 201 is commonly formed of single-crystal silicon, although alternative materials may be used, such as, but not limited to, germanium (Ge), gallium arsenide (GaAs), etc. Additionally, the substrate may have been modified by adding an impurity or dopant, such as by a diffusion or implant step, to change the conductivity of the material (e.g., n-type or p-type). In a preferred embodiment of the invention, the substrate 201 is of p-type conductivity.

The term "semiconductor layer" as may be used herein refers to any material upon which and/or in which other materials may be formed. The semiconductor layer may comprise a single layer, such as, for example, the substrate 201, or it may comprise multiple layers, such as, for example, the substrate 201 and epitaxial layer 202. The semiconductor wafer 200 comprises the substrate 201, with or without an epitaxial layer 202, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on or in which a circuit element may be formed.

The exemplary LDMOS device includes a source region 210 and a drain region 212 formed in the epitaxial layer 202 of the wafer 200, such as by a conventional implant and diffusion process. The source and drain regions are preferably doped, such as by a conventional implant step, with an impurity of a known concentration level to selectively change the conductivity of the material as desired. Preferably, the source and drain regions 210, 212 have a conductivity type associated therewith which is opposite a conductivity type of the substrate 201, so that active regions can be formed in the device. In a preferred embodiment of the invention, the source and drain regions 210, 212 are of n-type conductivity. Electrical connection between the source region 210 and the substrate 201 may be provided by forming one or more trench sinkers 228 through the epitaxial layer 202 of the wafer 200. The trench sinkers may be formed in a conventional manner, such as, for example, by opening windows in the epitaxial layer 202 (e.g., by photolithographic patterning and etching) to expose the substrate 201, and filling the trenches 228 with a conductive material, as will be understood by those skilled in the art. In a preferred embodiment of the invention, the trench sinkers 228 are of p-type conductivity.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

A channel region 216 and a drift region, which may comprise a first LDD region (ldd1) 218 and a second LDD region (ldd2) 214, are formed in the exemplary LDMOS device. The channel region 216 is formed near the source region 210 while the drift region extends from the channel region 216 to the drain region 212. The channel region 216 may be formed of a material having the same conductivity type as the substrate, preferably p-type. The drift region may be formed of material having the same conductivity type as the source and drain regions, preferably n-type, although the relative doping concentration of the drift region compared to the source and drain regions is typically lower.

The exemplary LDMOS device further includes a gate 220 formed above at least a portion of the channel region 216 and proximate an upper surface of the wafer 200. The gate maybe formed of, for example, polysilicon material, although alternative suitable materials (e.g., metal) may be similarly employed. A shielding electrode 222, which may be referred to herein as a dummy gate, is preferably formed in the exemplary LDMOS device between the gate 220 and the drain region 212. The dummy gate 222 is spaced laterally from the gate 220 and non-overlapping relative to the gate. It is to be appreciated that the dummy gate 222 maybe formed in virtually any configuration and/or shape that is non-overlapping with respect to the gate 220, as will be understood by those skilled in the art. The dummy gate 222 is formed in close relative proximity (e.g., 200 nanometers (nm)) to an upper surface of the wafer 200. As previously stated, the dummy gate 222 reduces the Miller capacitance Cgd between the gate and drain of the LDMOS device, thereby improving the high-frequency performance of the device, and reduces HCI degradation in the device.

The dummy gate 222 may be formed as a conductive plug (e.g., a metal via), although the present invention contemplates that alternative configurations and/or materials maybe used to form the dummy gate, as will be understood by those skilled in the art. Unlike conventional dummy gate structures, however, the dummy gate 222 in the exemplary LDMOS device of the present invention does not overlap the gate 220. Rather, dummy gate 222 is spaced laterally from the gate 220 (e.g., 0.6 microns (μm)).

Since the dummy gate 222 is spaced laterally from the gate 220, the distance between the dummy gate 222 and gate 220 is not limited by the thickness of a gate oxide layer 224 formed on at least a portion of the gate 220, as it is in a conventional LDMOS device. Forming the dummy gate 222 in this manner enables the dummy gate to be selectively located, in relation to the gate 220, so as to optimize an effectiveness of the dummy gate. As previously stated, the effectiveness of the dummy gate 222 may be representative of, for example, the amount of reduction in Miller capacitance Cgd and/or HCI degradation in the device. Furthermore, because the dummy gate 222 does not directly overlap the gate 220, the conventional dummy gate-on-gate stack is eliminated, thus making the exemplary LDMOS device fully compatible with a standard CMOS process technology. Additionally, full gate metalization, whereby a metal layer 226 is formed on an upper surface and/or sidewall of the gate 220, can be easily achieved. As previously stated, full gate metalization is desirable for reducing the gate resistance Rd and thereby increasing the output gain of the device, particularly when the device is operating at high frequencies.

The dummy gate 222 in the exemplary LDMOS device is electrically connected (i.e., strapped) to the source region 210 using, for example, a conductive trace 232, contact vias 234 and a conductive plug 236. The conductive trace 232 and contact vias 234 may be formed using a high level metalization process (e.g., second or higher level metal), while the conductive plug 236, which provides an electrical connection between the source region 210 and one of the contact vias 234, may be formed during the same process step used to form the dummy gate 222. The conductive trace 232, contact vias 234, conductive plug 236 and dummy gate 222 maybe fabricated, for example, by selectively patterning an oxide layer 230 formed on the upper surface of the wafer 200 followed by a metal deposition (e.g., metalization) step. Alternative methods of forming the electrical connection between the dummy gate 222 and the source region 210 are similarly contemplated by the present invention.

The conductive trace 232, as well as the contact vias 234, conductive plug 236 and dummy gate 222, are preferably spaced far enough from the gate 220 so that gate-to-source capacitance Cgs is not significantly increased. In a preferred embodiment of the invention, the conductive trace 232 bridging the dummy gate 222 to the source region 210 is spaced about one micron from the gate 220.

FIGS. 3A–3I depict steps in an illustrative methodology which may be used in forming the exemplary LDMOS device shown in FIG. 2, in accordance with one embodiment of the present invention. The illustrative methodology will be described in the context of a conventional CMOS compatible semiconductor fabrication process technology. It is to be understood that the invention is not limited to this or any particular methodology for fabricating the device.

Figure 3A:
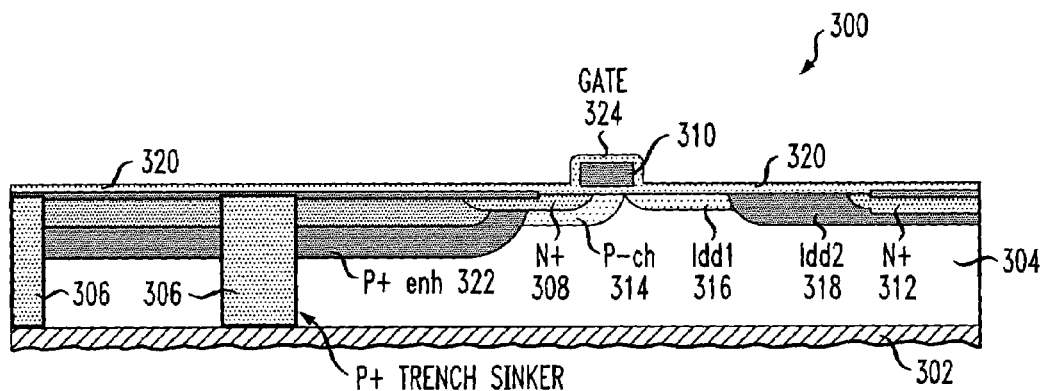

FIG. 3A depicts a cross section of at least a portion of an exemplary semiconductor wafer 300 in which the techniques of the present invention maybe implemented. The wafer 300 includes an LDMOS device formed on a substrate 302. The substrate 302 is preferably a p+ type substrate having a high conductivity, although an n+ type substrate may alternatively be employed. As will be understood by those skilled in the art, a p+ substrate may be formed by adding a p-type impurity or dopant (e.g., Boron) of a desired concentration (e.g., about $5 \times 10^{18}$ to about $5 \times 10^{19}$ atoms) to the substrate material, such as by a diffusion or implant step, to change the conductivity of the material as desired. The epitaxial layer 304 is then grown over the entire surface of the wafer. The epitaxial layer 304 may also be modified by adding a p-type impurity. A breakdown voltage of the resulting transistor structure is determined, at least in part, by the thickness and impurity concentration of the epitaxial layer 304. Connections (e.g., via one or more sinkers 306) between an upper surface of the wafer 300 and the p+ substrate 302 are preferably formed through epitaxial layer 304, followed by a field oxide formation (e.g., oxidation) step.

The LDMOS device may be formed on the substrate 302 in a conventional manner, having a source region 308, a gate 310 and a drain region 312. A p-body region 322 is formed in the epitaxial layer 304 such as, for example, by using a deep diffusion or implant step. During the diffusion step, a p-type impurity (e.g., Boron) of a predetermined concentration level is preferably used. A channel region 314 is formed in the epitaxial layer 304 under at least a portion of the gate 310 and adjacent to the p-body region 322. In a preferred embodiment, the channel region 314 may be formed, for example, by diffusing or implanting a p-type impurity of a known concentration level into the channel region.

First LDD region (ldd1) 316 and second LDD region (ldd2) 318 are preferably formed in the epitaxial layer 304 such as, for example, by using a diffusion or implant step. During the formation of the LDD regions 316 and 318, an n-type impurity (e.g., arsenic or phosphorous) of a predetermined concentration level is preferably employed. The LDD regions 316, 318 will form at least a portion of a drift region in the resulting LDMOS device. The source region 308 is then formed in the p-body region 322 and the drain region 312 is formed in the ldd2 region 318. The source and drain regions 308, 312 may be formed, for example, by diffusing or implanting an n-type impurity of a known concentration level into the respective regions 322, 318 of the device. An interlayer deposition step (not shown) may also be performed (e.g., oxide and/orborophosphosilicate glass (BPSG) deposition).

A thin oxide layer 320 is formed on the epitaxial layer 304. The thin oxide layer 320 may comprise an insulating material, such as, for example, silicon dioxide, that is grown or deposited on an upper surface of the wafer 300 to a desired thickness (e.g., about 300–400 angstroms). The gate 310 may be fabricated from a polycrystalline silicon (polysilicon) layer formed over the thin oxide layer 320, such as, for example, using a chemical vapor deposition (CVD) technique. The thin oxide layer 320 under the gate 310 is often referred to as gate oxide. The polysilicon layer is generally patterned using, for example, a conventional photolithographic process, and followed by an etching step (e.g., dry etching) to form the gate 310, as will be understood by those skilled in the art. An oxide layer 324 may also be formed over the polysilicon gate 310, such as, for example, by conventional oxidation techniques.

Figure 3B:
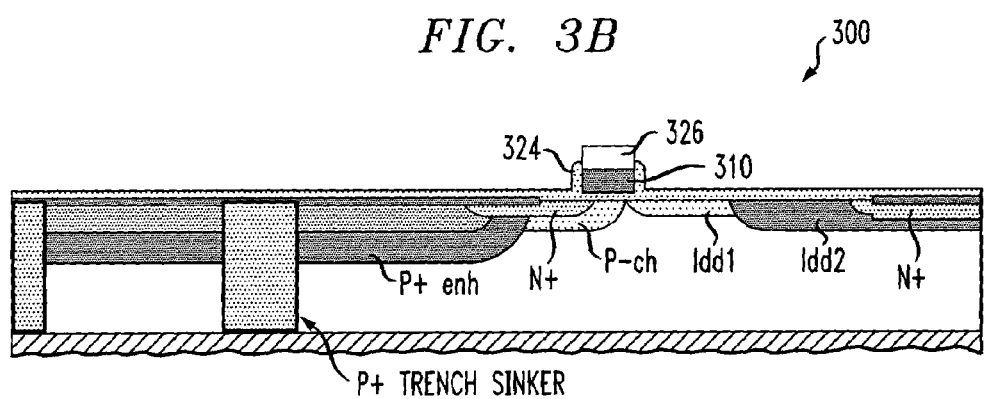

FIG. 3B depicts an optional gate metalization process which maybe used for advantageously reducing the gate resistance Rg of the LDMOS device, as previously explained. As shown in the figure, an exemplary gate metalization process may comprise forming an opening in the insulating layer 324, such as, for example, by patterning and etching the insulating layer 324 to expose at least a portion of the gate 310. A metal layer 326 is then deposited on the upper surface of the wafer 300 for forming an ohmic connection with the gate 310, followed by patterning and etching steps to remove the metal layer from selected portions of the wafer. The metal layer 326 may also be deposited on the gate 310 using an alternative process, such as, for example, sputtering. The metal layer 326 typically comprises aluminum due at least in part to its ease of deposition and patterning, as well as its high degree of conductivity and its ability to form ohmic contacts with silicon (e.g., in an alloying step).

Figure 3C:
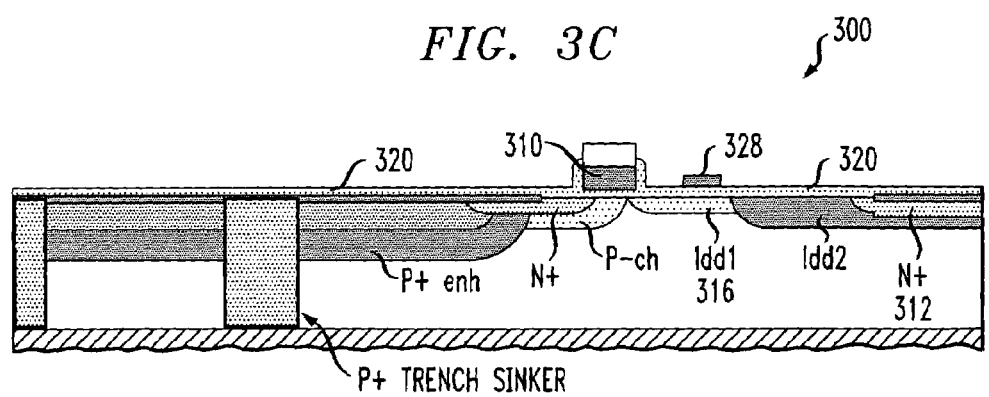

FIG. 3C illustrates a step of forming a base 328 for the dummy gate. The base 328 may be formed on the upper surface of thin oxide layer 320 and located between the gate 310 and drain region 312, such as, for example, over at least a portion of the first LDD region 316. The base 328 may be formed, for example, by depositing a metal layer, or alternative conductive layer, on the thin oxide layer 320, followed by conventional photolithographic patterning and etching. The base 328 will also serve as an etch stop for a subsequent process step.

Figure 3D:
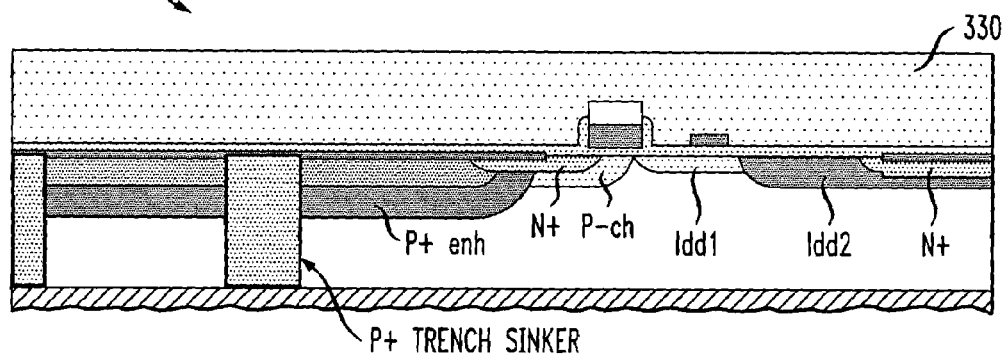
Figure 3E:
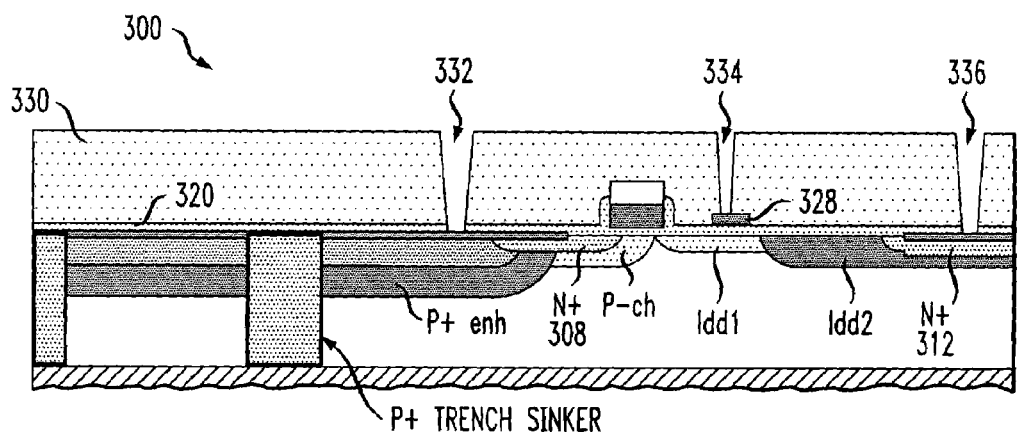

FIG. 3D depicts a process of forming a first oxide layer 330 on the upper surface of the wafer 300. The first oxide layer 330 may comprise an insulating material such as, but not limited to, silicon dioxide. The first oxide layer 330 may be formed of a desired thickness (e.g., 40 nm), for example, using a conventional oxidation process. An upper surface of the first oxide layer 330 is preferably made to be substantially planar, such as, for example, by performing a polishing or grinding step. One or more windows (i.e., openings) 332, 334 and 336 may be formed in the first oxide layer 330, as shown in FIG. 3E. The windows may be formed by conventional photolithographic patterning and etching. A first window 334 is preferably formed over at least a portion of the base 328. As previously stated, the base 328 serves as an etch stop to prevent etching through the thin oxide layer 320. Second and third windows 332 and 336 may be formed through the first oxide layer 330 to expose at least a portion of the source region 308 and drain region 312, respectively.

Figure 3F:
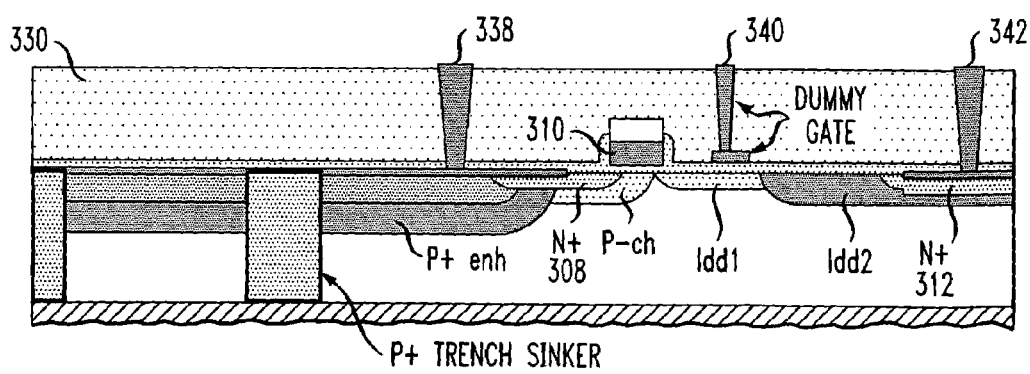

FIG. 3F illustrates a plug formation process. During this process, metal, or an alternative conductive material, is deposited in the windows 332, 334 and 336 to form plugs 338, 340 and 342, respectively. The plugs may be referred to herein as contact vias. The plug formation process may comprise, for example, a conventional metal deposition step, whereby metal (e.g., aluminum) is deposited over the upper surface of the wafer 300, followed by patterning and etching. Plug 340 forms at least a portion of a dummy gate, while plugs 338 and 342 maybe used to contact the source region 308 and drain region 312, respectively, of the exemplary LDMOS device. The dummy gate 340 can be readily formed during the same process step and in a manner consistent with the formation of the contact plugs 338, 342 to the source and drain regions, respectively, of the device. Thus, in accordance with one aspect of the invention, the dummy gate 340 is formed using fully CMOS process compatible techniques.

During this metal deposition step, a conductive trace (not shown) may be formed which electrically connects the dummy gate 340 to the source contact plug 338, thus connecting the dummy gate to the source region 308. Optionally, as will be shown in conjunction with FIGS. 3G and 3H, one or more additional oxide layers can be deposited on the wafer 300 to increase the distance between the dummy gate 340 and the gate 310. In this manner, a capacitive coupling between the dummy gate 340 and the gate 310 can be minimized.

With reference now to FIGS. 3G and 3H, the coupling between the dummy gate 340 and the gate 310 can be minimized by adding at least a second oxide layer 344 on the upper surface of the wafer 300, as previously stated. First, bases 346, 348 and 350 are preferably formed on the upper surface of the first oxide layer 330. Bases 346, 348, 350 are preferably formed over at least a portion of the source contact plug 338, dummy gate 340 and drain contact plug 342, respectively. The bases 346, 348, 350 may comprise a conductive material, such as, for example, a metal (e.g., aluminum) or polysilicon, and form substantially low-resistance (e.g., less than one ohm) electrical connections to their respective underlying plugs 338, 340, 342. As in the case of the base 328 associated with the dummy gate 340, bases 346, 348 and 350 serve as etch stops for a subsequent process step.

As shown in FIG. 3G, a second oxide layer 344 can be formed on the upper surface of the first oxide layer 330. The second oxide layer 344 may comprise an insulating material, such as, for example, silicon dioxide, and may be formed in a manner consistent with the formation of the first oxide layer 330 (e.g., using a conventional oxidation process). An upper surface of the second oxide layer 344 is preferably made substantially planar, such as, for example, by conventional polishing or grinding. One or more windows (i.e., openings) may be formed in the second oxide layer 344 such as, for example, by conventional photolithographic patterning and etching. Each window, which is formed over a corresponding base 346, 348, 350, is etched until at least a portion of the respective base is exposed. A metal, or alternative conductive material, is then deposited in each of the windows in the second oxide layer 344, thereby forming conductive plugs 352, 354 and 356 in the second oxide layer 344. The plugs 352, 354, 356, which may be referred to herein as contact vias, preferably form a substantially low-resistance electrical connection with corresponding plugs 338, 340 and 342, respectively.

FIG. 3H illustrates a process for forming a conductive trace 358 on an upper surface of the second oxide layer 344 which provides an electrical connection between the dummy gate 340 and the source region 308. The conductive trace 358 may be formed using a conventional metalization process, which may comprise photolithographic patterning and etching. A first end of the conductive trace 358 is preferably connected to plug 352 corresponding to the source region 308 while a second end of the conductive trace is connected to plug 354 corresponding to the dummy gate 340. The conductive trace 358 may also be employed as a source contact for the exemplary LDMOS device. During the metalization process, a drain contact 362 may also be formed. The drain contact 362 is connected to plug 356.

A third oxide layer 360 may be formed on the upper surface of the second oxide layer 344. The third oxide layer is preferably made substantially planar, such as, for example, by conventional polishing or grinding. The third oxide layer may comprise an insulating material such as, for example, silicon dioxide, and may be formed in a manner consistent with the formation of the first and second oxides layers 330 and 344, respectively.

Figure 3I:
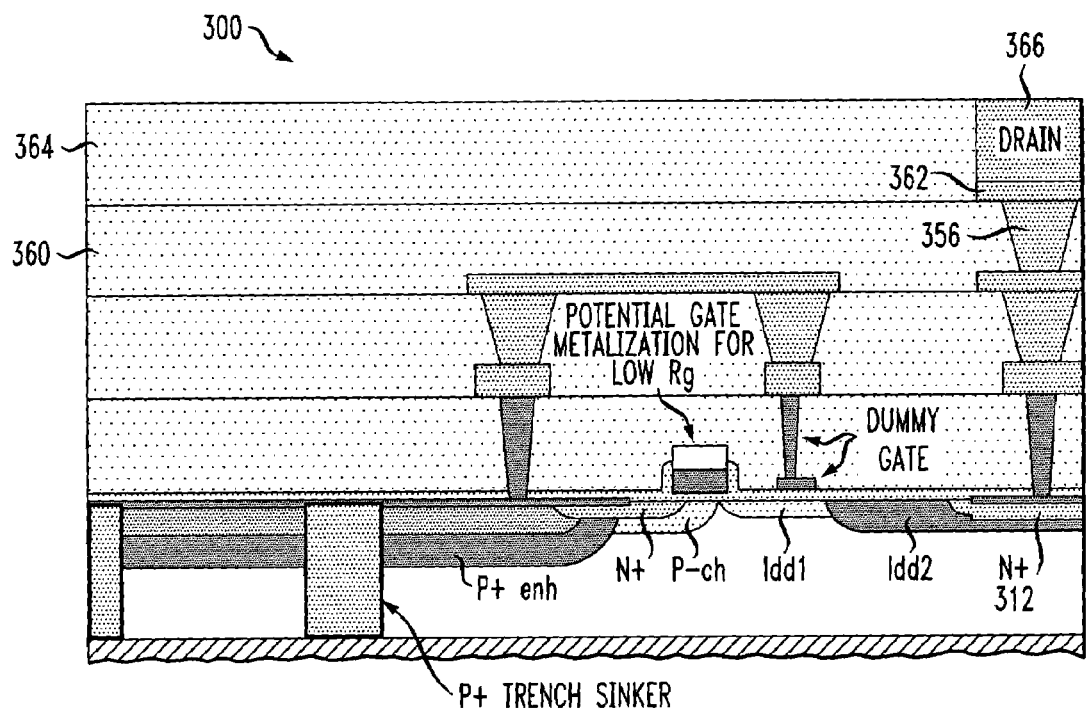

FIG. 3I illustrates at least a portion of completed exemplary LDMOS device, in accordance with one embodiment of the invention. As apparent from the figure, a fourth oxide layer 364 may be optionally formed on an upper surface of the third oxide layer 360 using, for example, a conventional oxidation process. A window is preferably formed through the fourth oxide layer 364 to expose at least a portion of the drain contact 362. The window may be formed, for example, using a conventional patterning and etch process. The drain contact 362 serves as an etch stop during the etch process. A metal, or alternative conductive material, is then deposited in the window formed in the fourth oxide layer 364 to form a drain terminal 366 for providing an electrical connection to the drain region 312 of the exemplary LDMOS device.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor (MOS) device, comprising:
a semiconductor layer of a first conductivity type;
a first source/drain region of a second conductivity type formed in the semiconductor layer;
a second source/drain region of the second conductivity type formed in the semiconductor layer and spaced apart from the first source/drain region;
a gate formed proximate an upper surface of the semiconductor layer and at least partially between the first and second source/drain regions; and
a shielding structure formed proximate the upper surface of the semiconductor layer and between the gate and the second source/drain region, the shielding structure being electrically connected to the first source/drain region by way of a connection comprising a substantially vertical conductor formed in a region of the device overlying an active area of the device between the gate and the second source/drain region, the shielding structure being spaced laterally from the gate and being non-overlapping relative to the gate.

2. The device of claim 1, wherein the shielding structure is connected to the first source/drain region by a conductive trace, the conductive trace being spaced substantially from the gate by an insulating layer formed between the gate and the conductive trace.

3. The device of claim 2, wherein the conductive trace is formed using a metalization process.

4. The device of claim 2, wherein the conductive trace is formed using at least a second level metalization process.

5. The device of claim 2, wherein the insulating layer comprises an oxide.

6. The device of claim 1, wherein the first source/drain region is a source of the device and the second source/drain region is a drain of the device.

7. The device of claim 1, wherein the device comprises a diffused MOS (DMOS) device.

8. The device of claim 1, wherein the device comprises a laterally diffused MOS (LDMOS) device.

9. The device of claim 1, wherein the shielding structure is formed relative to the gate such that a capacitance between the gate and the second source/drain region is minimized without substantially increasing a capacitance between the gate and the first source/drain region.

10. The device of claim 1, wherein the shielding structure comprises at least one conductive plug.

11. The device of claim 1, further comprising an insulting layer formed on at least a portion of an upper surface of the device, the shielding structure comprising a conductive plug formed at least partially through the insulating layer.

12. A metal-oxide-semiconductor (MOS) device, comprising:
a semiconductor layer of a first conductivity type;
a first source/drain region of a second conductivity type formed in the semiconductor layer;
a second source/drain region of the second conductivity type formed in the semiconductor layer and spaced apart from the first source/drain region;
a gate formed proximate an upper surface of the semiconductor layer and at least partially between the first and second source/drain regions;
a shielding structure formed proximate the upper surface of the semiconductor layer and between the gate and the second source/drain region, the shielding structure being electrically connected to the first source/drain region by way of a connection comprising a substantially vertical conductor formed in a region of the device overlying an active area of the device between the gate and the second source/drain region, the shielding structure being spaced laterally from the gate and being non-overlapping relative to the gate; and
a conductive layer formed on an upper surface of the gate such that the conductive layer substantially covers the upper surface of the gate, whereby a resistance of the gate is reduced.

13. An integrated circuit including at least one metal-oxide-semiconductor (MOS) device, the at least one MOS device comprising:
a semiconductor layer of a first conductivity type;
a first source/drain region of a second conductivity type formed in the semiconductor layer;
a second source/drain region of the second conductivity type formed in the semiconductor layer and spaced apart from the first source/drain region;
a gate formed proximate an upper surface of the semiconductor layer and at least partially between the first and second source/drain regions; and
a shielding structure formed proximate the upper surface of the semiconductor layer and between the gate and the second source/drain region, the shielding structure being electrically connected to the first source/drain region by way of a connection comprising a substantially vertical conductor formed in a region of the device overlying an active area of the device between the gate and the second source/drain region, the shielding structure being spaced laterally from the gate and being non-overlapping relative to the gate.

14. The integrated circuit of claim 13, wherein the shielding structure in the at least one MOS device is connected to the first source/drain region by a conductive trace, the conductive trace being spaced substantially from the gate by an insulating layer formed between the gate and the conductive trace.

15. The integrated circuit of claim 13, wherein the at least one MOS device comprises a laterally diffused MOS (LDMOS) device.

16. The integrated circuit of claim 13, wherein the shielding structure in the at least one MOS device is formed relative to the gate such that a capacitance between the gate and the second source/drain region is minimized without substantially increasing a capacitance between the gate and the first source/drain region.

17. An integrated circuit including at least one metal-oxide-semiconductor (MOS) device, the at least one MOS device comprising:

a semiconductor layer of a first conductivity type;

a first source/drain region of a second conductivity type formed in the semiconductor layer;

a second source/drain region of the second conductivity type formed in the semiconductor layer and spaced apart from the first source/drain region;

a gate formed proximate an upper surface of the semiconductor layer and at least partially between the first and second source/drain regions;

a shielding structure formed proximate the upper surface of the semiconductor layer and between the gate and the second source/drain region, the shielding structure being electrically connected to the first source/drain region by way of a connection comprising a substantially vertical conductor formed in a region of the device overlying an active area of the device between the gate and the second source/drain region, the shielding structure being spaced laterally from the gate and being non-overlapping relative to the gate; and a conductive layer formed on an upper surface of the gate such that the conductive layer substantially covers the upper surface of the gate, whereby a resistance of the gate is reduced.

* * * * *